(12) United States Patent
Koo et al.

(10) Patent No.: US 10,528,469 B2
(45) Date of Patent: Jan. 7, 2020

(54) MEMORY SYSTEM FOR WRITING DATA BASED ON TYPES OF COMMAND AND DATA AND OPERATING METHOD OF THE SAME

(71) Applicant: SK hynix Inc., Gyeonggi-do (KR)

(72) Inventors: Duck-Hoi Koo, Gyeonggi-do (KR); Soong-Sun Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/672,826

(22) Filed: Aug. 9, 2017

(65) Prior Publication Data

US 2018/0196749 A1 Jul. 12, 2018

(30) Foreign Application Priority Data

Jan. 12, 2017 (KR) .................. 10-2017-0005057

(51) Int. Cl.
| | | |
|---|---|---|
| G06F 12/0804 | (2016.01) | |
| G06F 12/0866 | (2016.01) | |
| G06F 12/02 | (2006.01) | |
| G06F 12/06 | (2006.01) | |
| G06F 13/16 | (2006.01) | |
| G11C 7/10 | (2006.01) | |
| G11C 16/10 | (2006.01) | |

(52) U.S. Cl.
CPC ...... *G06F 12/0804* (2013.01); *G06F 12/0246* (2013.01); *G06F 12/06* (2013.01); *G06F 12/0866* (2013.01); *G06F 13/16* (2013.01); *G11C 7/1006* (2013.01); *G11C 16/10* (2013.01)

(58) Field of Classification Search
CPC .. G06F 12/0246; G06F 12/06; G06F 12/0804; G06F 12/0866; G06F 13/16; G06F 3/0611; G06F 3/0614; G06F 3/0626; G06F 3/064; G06F 3/0658; G06F 3/0659; G11C 16/10; G11C 7/1006
See application file for complete search history.

(56) References Cited

U.S. PATENT DOCUMENTS

| | | | | |
|---|---|---|---|---|
| 2009/0222617 | A1* | 9/2009 | Yano ................... | G06F 12/0246 711/103 |
| 2012/0124276 | A1* | 5/2012 | Ahn .................... | G06F 12/0246 711/103 |
| 2013/0282955 | A1* | 10/2013 | Parker ................. | G06F 12/0246 711/103 |
| 2014/0219020 | A1* | 8/2014 | Kwak .................... | G11C 16/10 365/185.03 |

FOREIGN PATENT DOCUMENTS

| | | |
|---|---|---|
| KR | 1020120003282 | 1/2012 |
| KR | 1020130123955 | 11/2013 |
| KR | 1020140121159 | 10/2014 |

* cited by examiner

*Primary Examiner* — Ann J Lo
*Assistant Examiner* — Jane Wei
(74) *Attorney, Agent, or Firm* — IP & T Group LLP

(57) ABSTRACT

An memory system includes a memory device that includes a first memory block and a super memory block including simultaneously controllable second memory blocks and a controller including a memory, and suitable for storing a data corresponding to a command in the memory, deciding a type of the command and a type of the data, and controlling the memory device to write the data in the first memory block or the super memory block based on the type of the command and the type of the data.

10 Claims, 12 Drawing Sheets

MEMORY SYSTEM FOR WRITING DATA BASED ON TYPES OF COMMAND AND DATA AND OPERATING METHOD OF THE SAME

CROSS-REFERENCE TO RELATED APPLICATIONS

This U.S. non-provisional patent application claims priority under 35 U.S.C. § 119(a) to Korean Patent Application No. 10-2017-005057, filed on Jan. 12, 2017 in the Korean Intellectual Property Office (KIPO), the disclosure of which is incorporated herein by reference in its entirety.

BACKGROUND

1. Field

Exemplary embodiments of the present invention relate to a memory system and, more particularly, to a memory system including a memory device for processing data, and an operating method of the memory system.

2. Description of the Related Art

The computer environment paradigm has changed to ubiquitous computing systems that can be used anytime and anywhere. Due to this fact, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

SUMMARY

Various embodiments are directed to a controller and an operating method thereof, capable of minimizing complexity and performance deterioration of a memory system and maximizing use efficiency of a memory device, thereby quickly and stably processing data with respect to the memory device.

In accordance with an embodiment of the present invention, a memory system includes: a memory device that includes a first memory block and a super memory block including simultaneously controllable second memory blocks; and a controller including a memory, and suitable for storing a data corresponding to a command in the memory, deciding a type of the command and a type of the data, and controlling the memory device to write the data in the first memory block or the super memory block based on the type of the command and the type of the data.

When the type of the command is a cache flush command, the controller may control the memory device to write the data in the super memory block.

When the type of the command is a write command and a Force Unit Access (FUA) command, the controller may control the memory device to write the data in the first memory block.

When the type of the command is a write command and the type of the data is a random data, the controller may control the memory device to write the data in the first memory block.

When the type of the command is a write command and the type of the data is a sequential data, the controller may control the memory device to write the data in the super memory block.

The controller may control the memory device to simultaneously write the data in the super memory block by controlling the memory device in an interleaving method.

The controller may control the memory device to perform a one-shot program operation with the data so that the data is programmed in the second memory blocks.

When a size of the data is less than a storage capacity of the super memory block, the controller may control the memory device to write the data with dummy data in the super memory block.

When a size of the data is less than a storage capacity of the super memory block, the controller may control the memory device to write the data with another data of the memory in the super memory block.

Each of memory cells included in the first memory block and the super memory block may store two or more bits.

In accordance with another embodiment of the present invention, a method for operating a memory and a memory device including a first memory block and a super memory block having simultaneously controllable second memory blocks may include: storing a data corresponding to a command in the memory; deciding a type of the command and a type of the data; and controlling the memory device to write the data in the first memory block or the super memory block based on the type of the command and the type of the data.

In the controller controlling the memory device, when the type of the command is a cache flush command, the controlling of the memory device may be performed to write the data in the super memory block.

In the controller controlling the memory device when the type of the command is a write command and a Force Unit Access (FUA) command, the controlling of the memory device may be performed to write the data in the first memory block.

In the controller controlling the memory device, when the type of the command is a write command and the type of the data is a random data, the controlling of the memory device may be performed to write the data in the first memory block.

In the controller controlling the memory device, when the type of the command is a write command and the type of the data is a sequential data, the controlling of the memory device may be performed to write the data in the super memory block.

In the controller controlling the memory device, the controlling of the memory device may be performed to simultaneously write the data in the super memory block through an interleaving method.

In the controller controlling the memory device, the controlling of the memory device may be performed to perform a one-shot program operation with the data so that the data is programmed in second memory blocks.

In the controller controlling the memory device, when a size of the data is less than a storage capacity of the super memory block, the controlling of the memory device may be performed to write the data with dummy data in the super memory block.

In the controller controlling the memory device, when a size of the data is, less than a storage capacity of the super memory block, the controlling of the memory device may be performed to write the data with another data of the memory in the super memory block.

Each of memory cells included in the first memory block and the super memory block may store two or more bits.

DETAILED DESCRIPTION

Figure 1:
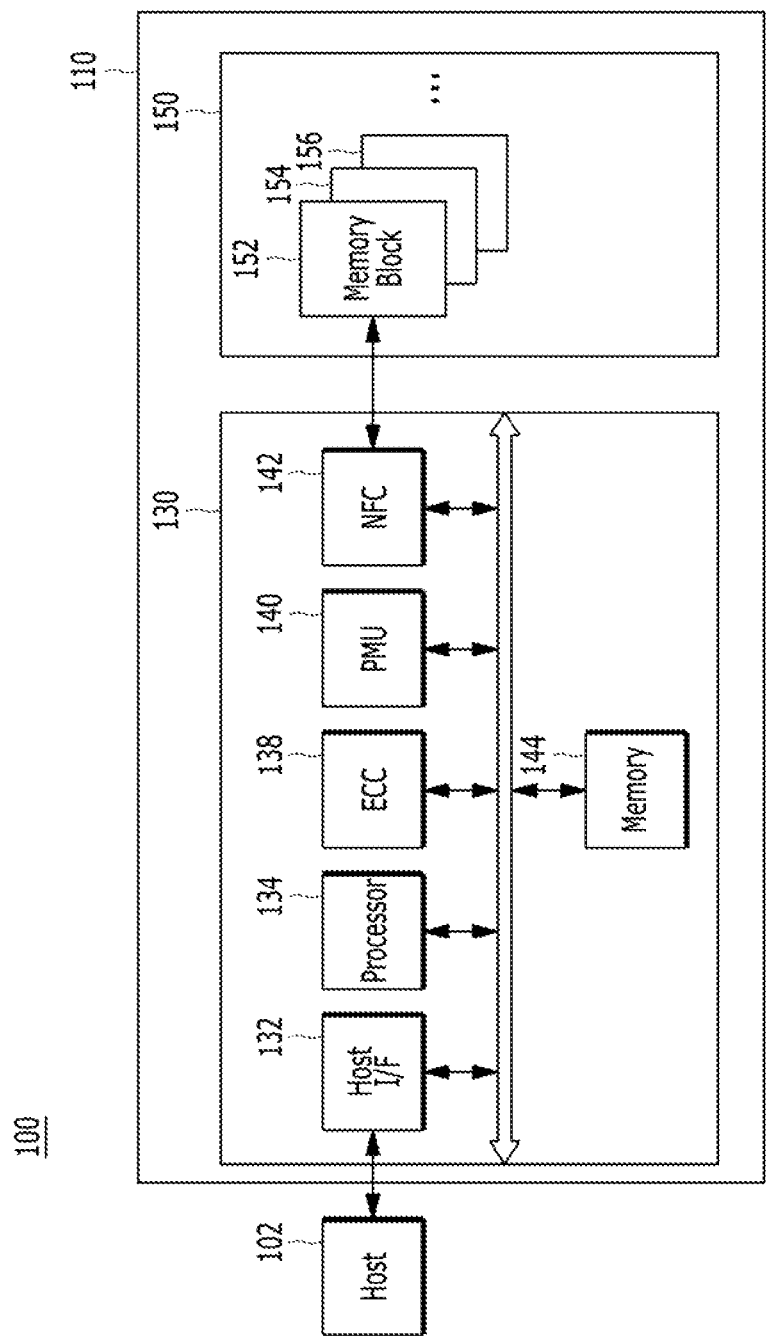
FIG. 1 is a block diagram illustrating a data processing system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include portable electronic devices such as a mobile phone, MP3 player and laptop computer or non-portable electronic devices such as a desktop computer, game machine, TV and projector.

The memory system 110 may operate to store data for the host 102 in response to a request of the host 102. Non-limited examples of the memory system 110 may include solid state drive (SSD), multi-media card (MMC), secure digital (SD) card, universal storage bus (USB) device, universal flash storage (UFS) device, compact flash (CF) card, smart media card (SMC), personal computer memory card international association (PCMCIA) card and memory stick. The MMC may include an embedded MMC (eMMC), reduced size MMC (RS-MMC) and micro-MMC, and the SD card may include a mini-SD card and micro-SD card.

The memory system 110 may be embodied by various types of storage devices. Non-limited examples of storage devices included in the memory system 110 may include volatile memory devices such as DRAM dynamic random access memory (DRAM) and static RAM (SRAM) and nonvolatile memory devices such as read only memory (ROM), mask ROM (MROM), programmable ROM (PROM), erasable programmable ROM (EPROM), electrically erasable programmable ROM (EEPROM), ferroelectric RAM (FRAM), phase-change RAM (PRAM), magnetoresistive RAM (MRAM), resistive RAM (RRAM) and flash memory. The flash memory may have a 3-dimensioanl (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA) a portable computer, a web tablet, a tablet computer a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
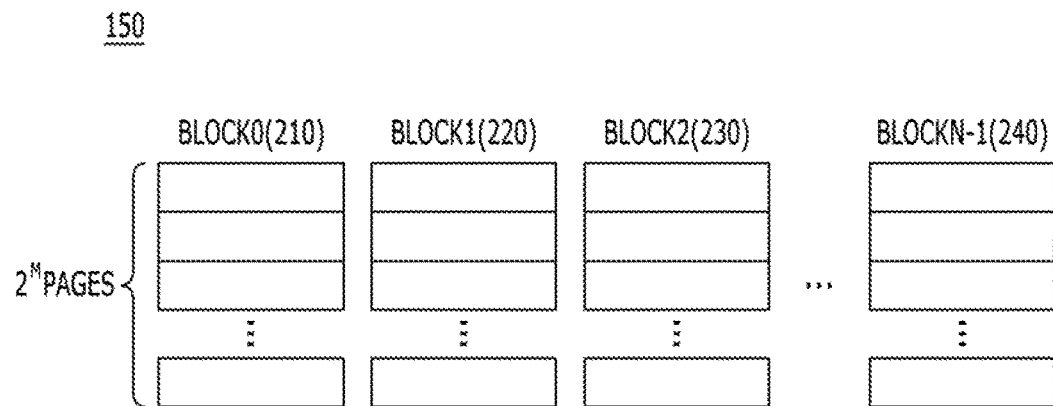
FIG. 2 is a schematic diagram illustrating a memory device employed in the memory system shown in FIG. 1.

FIG. 2 is a schematic diagram illustrating the memory device 150.

Referring to FIG. 2, the memory device 150 may include a plurality of memory blocks 0 to N-1, and each of the blocks 0 to N-1 may include a plurality of pages, for example, $2^M$ pages, the number of which may vary according to circuit design. Memory cells included in the respective memory blocks 0 to N-1 may be one or more of a single level cell (SLC) storing 1-bit data, a multi-level cell (MLC) storing 2-bit data, a triple level cell (TLC) storing 3-bit data, a quadruple level cell (QLC) storing 4-bit level cell, a multiple level cell storing 5-or-more-bit data and so forth.

Figure 3:
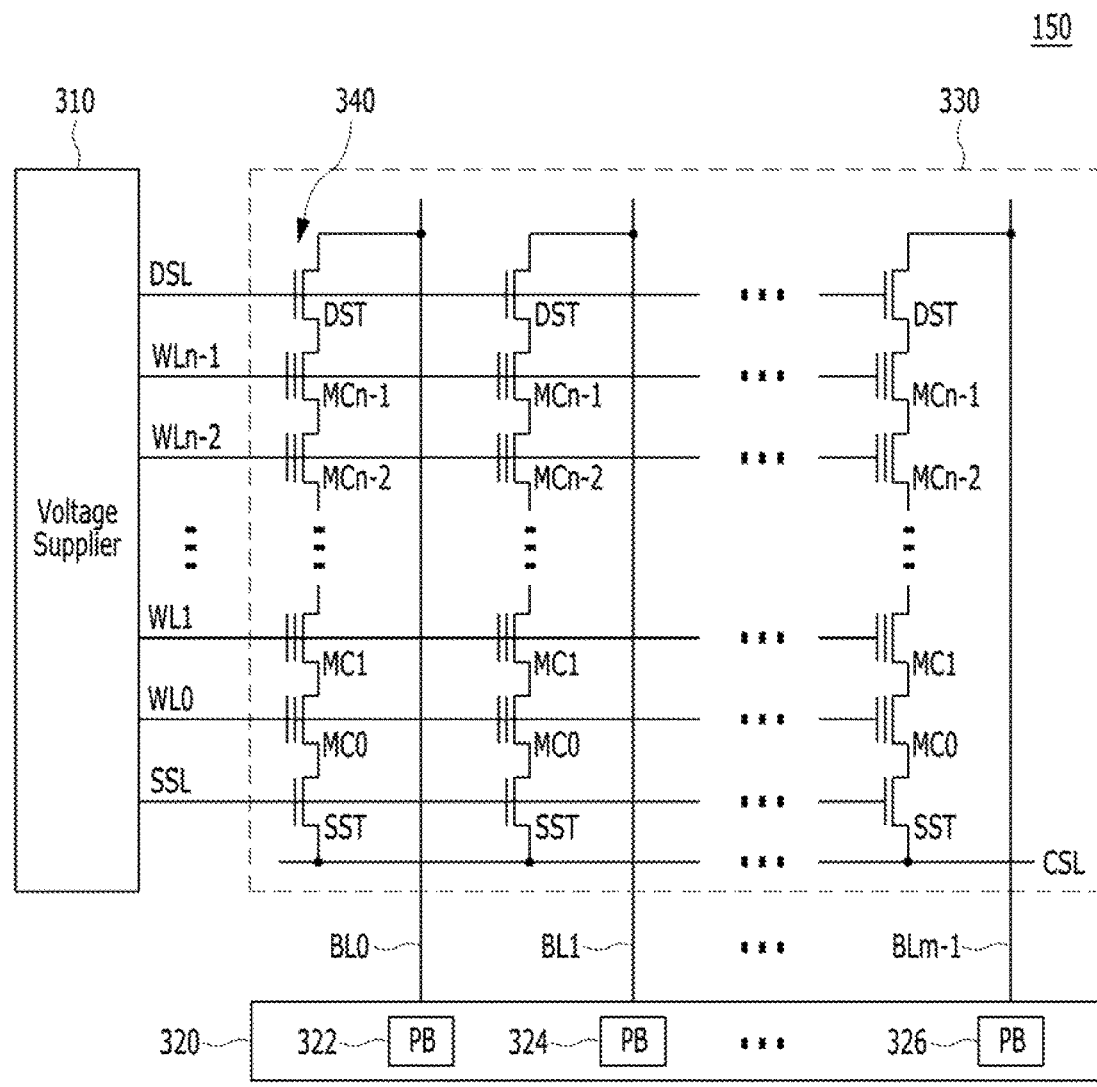
FIG. 3 is a circuit diagram illustrating an exemplary configuration of a memory cell array of a memory block in the memory device shown in FIG. 2.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm-1. The cell string 340 of each column may Include one or more drain select transistors DST and one or more source select transistors SST. Between the select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
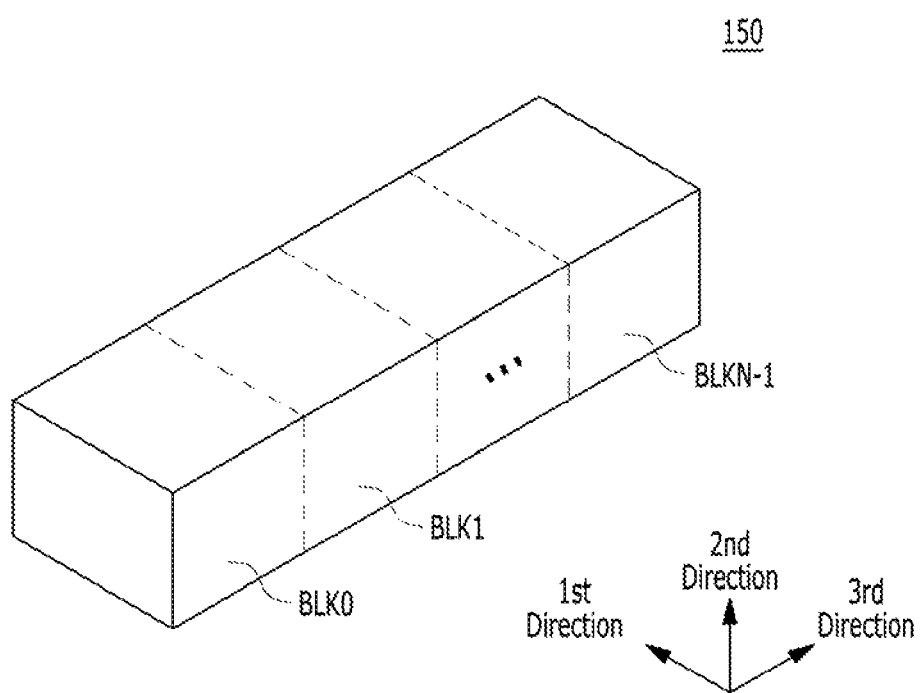
FIG. 4 is a schematic diagram illustrating an exemplary 3-D structure of the memory device of FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1 each of the memory blocks having a 3D structure (or vertical structure).

Figure 5:
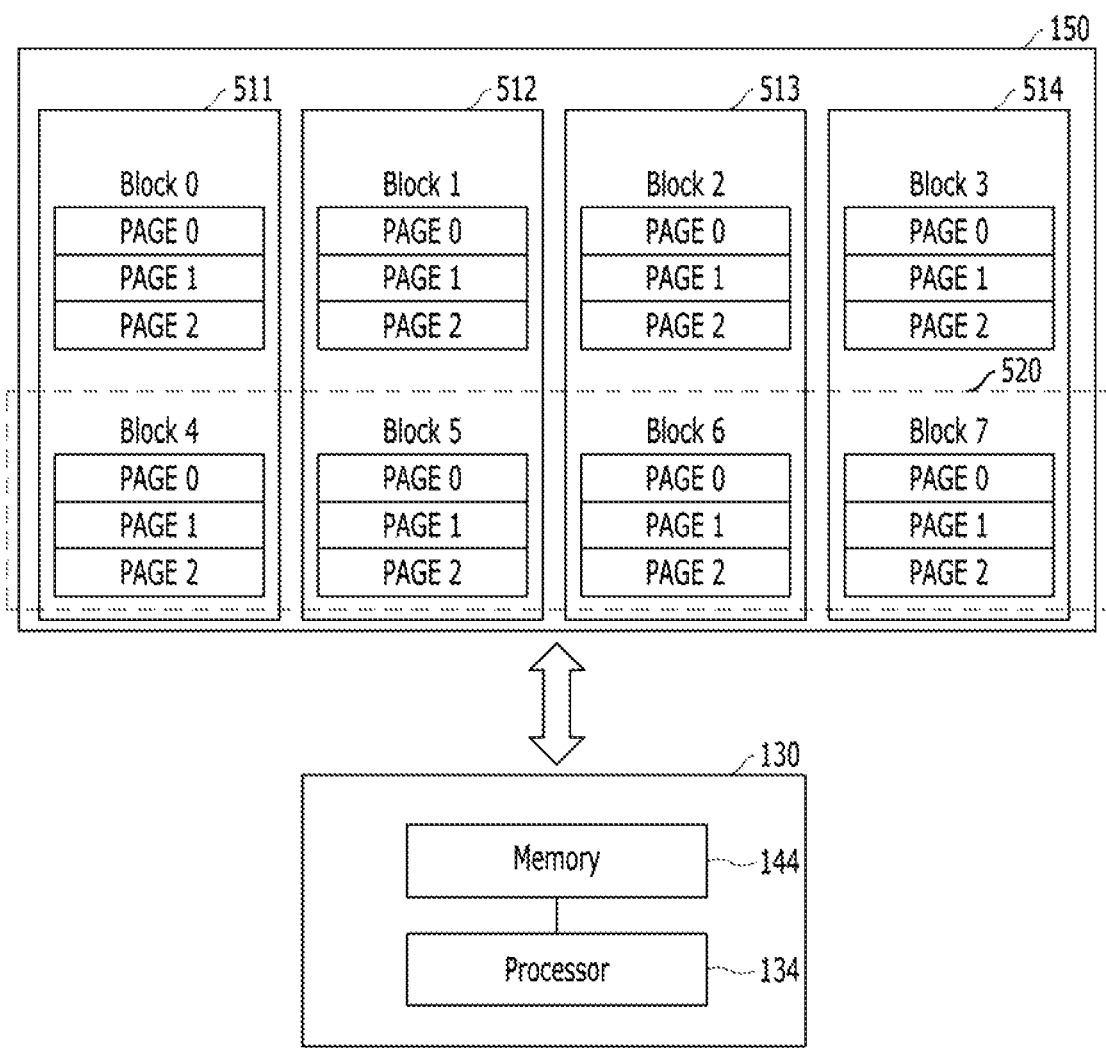
FIG. 5 illustrates the memory system of FIG. 1.

FIG. 5 illustrates the memory system 110.

The memory system 110 may include the controller 130 and the memory device 150. The controller 130 may include the processor unit 134 and the memory unit 144.

The processor unit 134 may individually control or simultaneously control the memory blocks of the memory device 150. Also, the processor unit 134 may manage the memory blocks of the memory device 150 by grouping them into memory block groups, each of which includes super memory blocks controlled simultaneously. FIG. 5 exemplarily shows a memory system where the processor unit 134 controls first memory blocks BLK 0 to BLK 3 of memory dies 511 to 514 of the memory device 150 individually, and controls second memory blocks BLK 4 to BLK 7 of the memory dies 511 to 514 of the memory device 150 simultaneously as a single super memory block 520.

When a data is written in the second memory blocks BLK 4 to BLK 7 or the super memory block 520, the processor unit 134 may control simultaneously the second memory blocks BLK 4 to BLK 7 through an interleaving method, such as a channel interleaving method, a memory die interleaving method, a memory chip interleaving method, and a way interleaving method.

The processor unit 134 may process a command of the host 102 by using the memory unit 144 of the controller 130. To be specific, when a command is provided from the host 102, the processor unit 134 may store a data corresponding to the command in the memory unit 144, and write the data in the first memory blocks BLK 0 to BLK 3 or in the super memory block 520 of the memory dies 511 to 514 of the memory device 150.

The processor unit 134 may be able to collectively write the data corresponding to the command in the first memory blocks BLK 0 to BLK 3 or the super memory block 520 through a one-shot program operation. To be specific, for example, the processor unit 134 may write the data corresponding to the received command simultaneously in the three pages of the first memory block BLK 0. Also, the processor unit 134 may write the data corresponding to the received command simultaneously in the 12 pages of the super memory block 520. Although it is illustrated in FIG. 5 that one memory block includes three pages and one super memory block includes four memory blocks, this is not more than one embodiment and the number of the pages that are included in one memory block and the number of the memory blocks that are included in one super memory block are not limited in this way.

Also, when the size of a data corresponding to a received command is less than a first reference size (e.g., a data size equal to or less than a storage capacity of the three pages of the first memory block BLK 0), the processor unit 134 may add as many dummy data as needed to the data corresponding to the command to make up for the difference between the size of the data of the received command and the first reference size, and then the processor 134 may perform a one-shot program operation with the dummy-added data in the first memory block BLK 0. For example, when a data corresponding to a received command can be stored in two pages, the processor unit 134 may add to the data a dummy data of a size corresponding to one page, and then perform a one-shot program operation with the dummy-added data in the first memory block BLK 0.

When the size of a data corresponding to a received command is greater than the first reference size (e.g., a data size equal to or less than a storage capacity of the three pages of the first memory block BLK 0) but smaller than a second reference size corresponding to the size of a super memory block, the processor unit 134 may add as many dummy data as needed to the data corresponding to the command to make up for the difference between the size of the data of the received command and the second reference size. Then the processor unit 134 may perform a one-shot program operation with the dummy-added data in the super memory block 520. For example, when a data corresponding to a command can be stored in 8 pages, the processor unit 134 may add to the data a dummy data of a size corresponding to 4 pages, and then perform a one-shot program operation with the dummy-added data in the super memory block 520.

Alternatively, during a write operation to the super memory block 520, the processor unit 134 may wait until a data of a second reference size is stored in the memory unit 144, and then perform a one-shot program operation with the data of the second reference size to the super memory block 520, so that the data of the second reference size stored in the memory unit 144 is programmed in the super memory block 520.

As described above, the present invention provides and elegant solution to an issue associated with existing systems, which when a processor unit writes a data of a small size in the super memory block, there is a problem in that the storage space of the memory device is likely to be used wastefully. Also, since a data has to be stored in the memory unit of the controller for quite a long time for the processor unit to write the stored data of the memory unit into a super memory block, the processor unit may not fully take advantage of the memory unit. For this reason, the performance of an existing memory system may be deteriorated. Also, when the processor unit 134 of the present invention writes a data in the first memory blocks BLK 0 to BLK 3, the read operation performance of the memory system 110 is improved because the data stored in the first memory blocks BLK 0 to BLK 3 may be read through an interleaving method. Therefore, according to the present invention, it is required to select memory blocks to be used for storing a data between the first memory blocks BLK 0 to BLK 3 and the super memory block 520 and write the data in the selected memory blocks.

In accordance with the embodiment of the present invention, the processor unit 134 of the memory system 110 may select at least one between the first memory blocks BLK 0 to BLK 3 and the super memory block 520 based on the type of a command and data corresponding to the command provided from the host 102 and write the data in the selected memory block.

For example, the command may be a Force Unit Access (FUA) command, and the processor unit 134 may write the data corresponding to the FUA command in the first memory blocks BLK 0 to BLK 3. The FUA command may be a command for instantly writing the data in the memory device 150.

In another example, when the command transferred from the host 102 is a cache flush command, the processor unit 134 may write the data corresponding to the cache flush command in the super memory block 520. Herein, the cache flush command may be a command for writing the data of the memory unit 144 in the memory device 150.

Subsequently, as for the type of the data corresponding to the command, when the data corresponding to the command is a random data, the processor unit 134 may write the data in the first memory blocks BLK 0 to BLK 3. Herein, the random data may be data whose logic block addresses are not consecutive.

Also, as for the type of the data corresponding to the command, when the data is a sequential data, the processor unit 134 may write the data corresponding to the command in the super memory block 520. Herein, the sequential data may be data whose logic block addresses are consecutive.

Hereafter, it is assumed that the command is a write command but not an FUA command.

Figure 6:
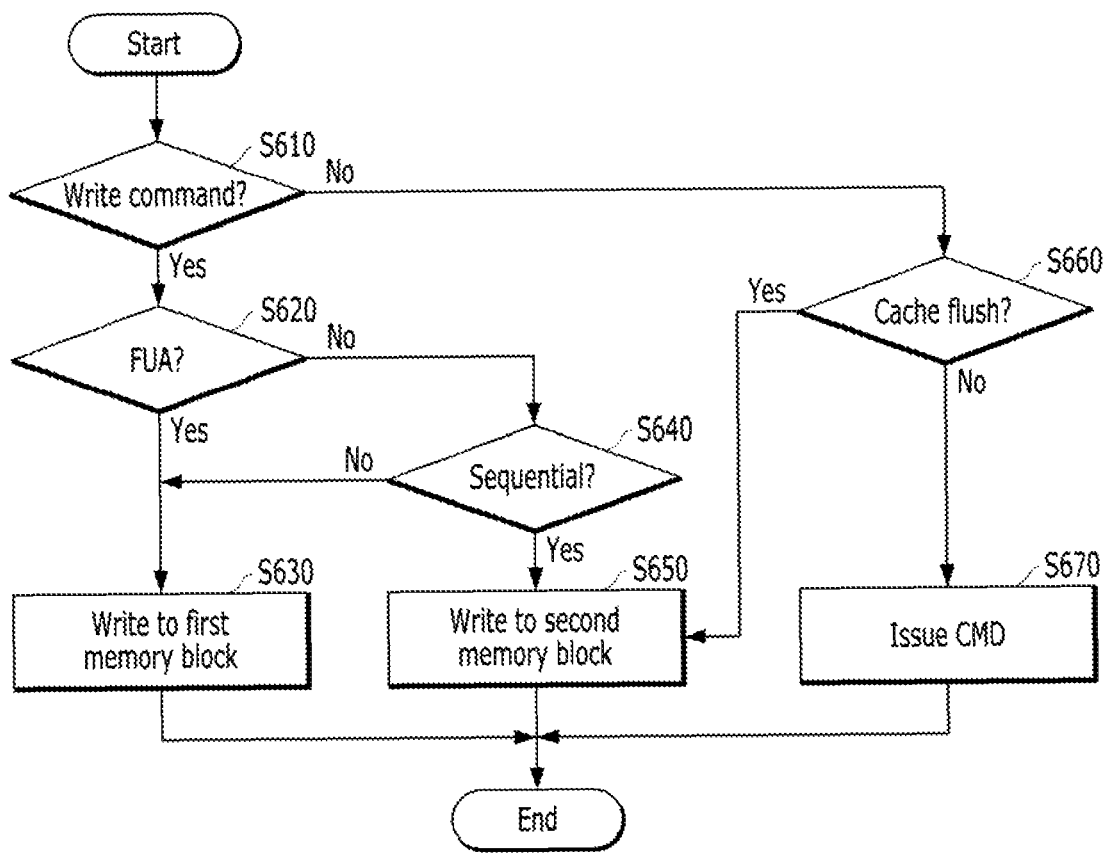
FIG. 6 is a flowchart illustrating a method for operating a processor unit of the memory system in accordance with the embodiment of the present invention.

FIG. 6 is a flowchart illustrating a method for operating the processor unit 134 of the memory system 110, in accordance with an embodiment of the present invention.

Figure 7:
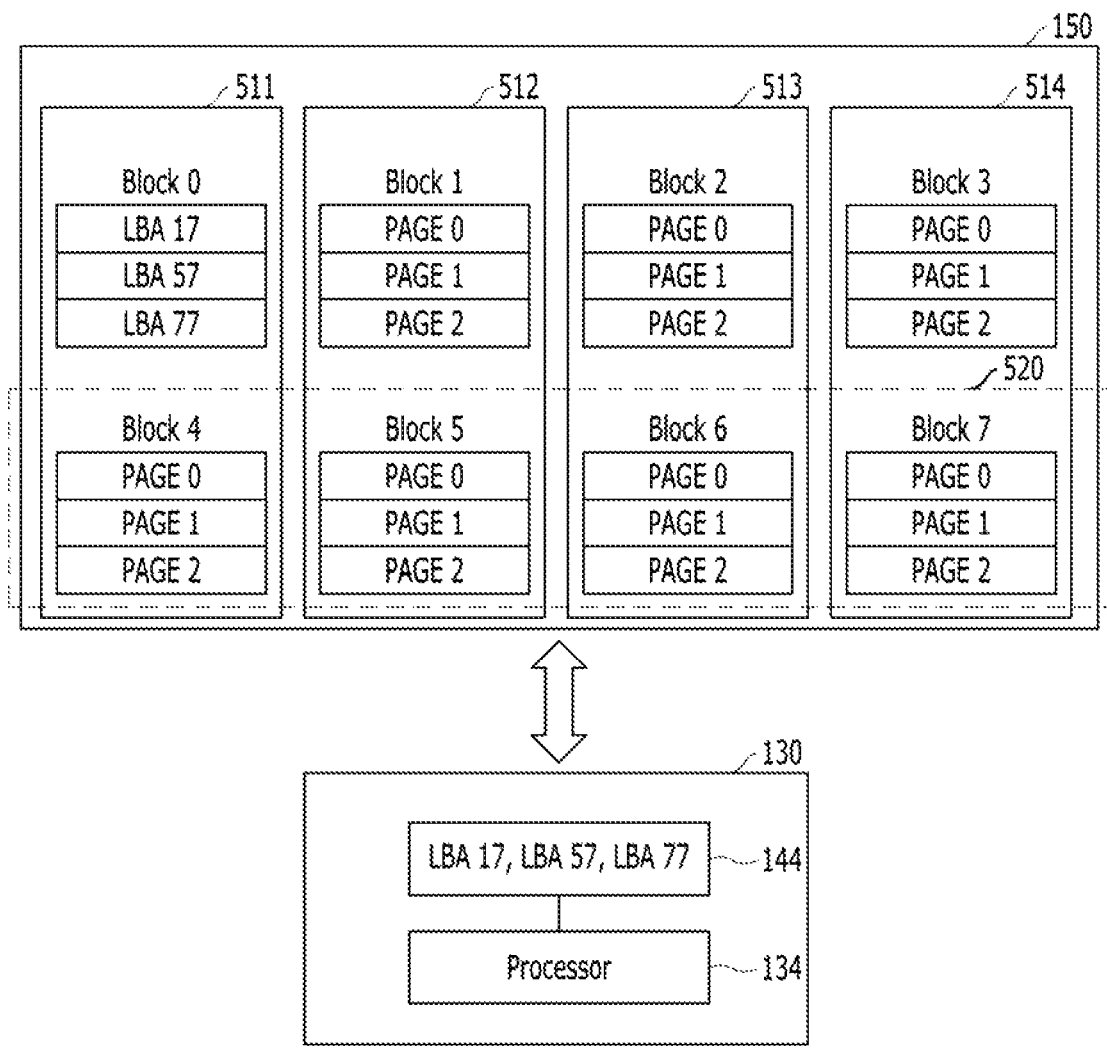
FIG. 7 illustrates a program operation to a memory block in accordance with the embodiment of the present invention.

FIG. 7 illustrates a program operation to the first memory block BLOCK 0 in the memory system 110, in accordance with the embodiment of the present invention.

Figure 8:
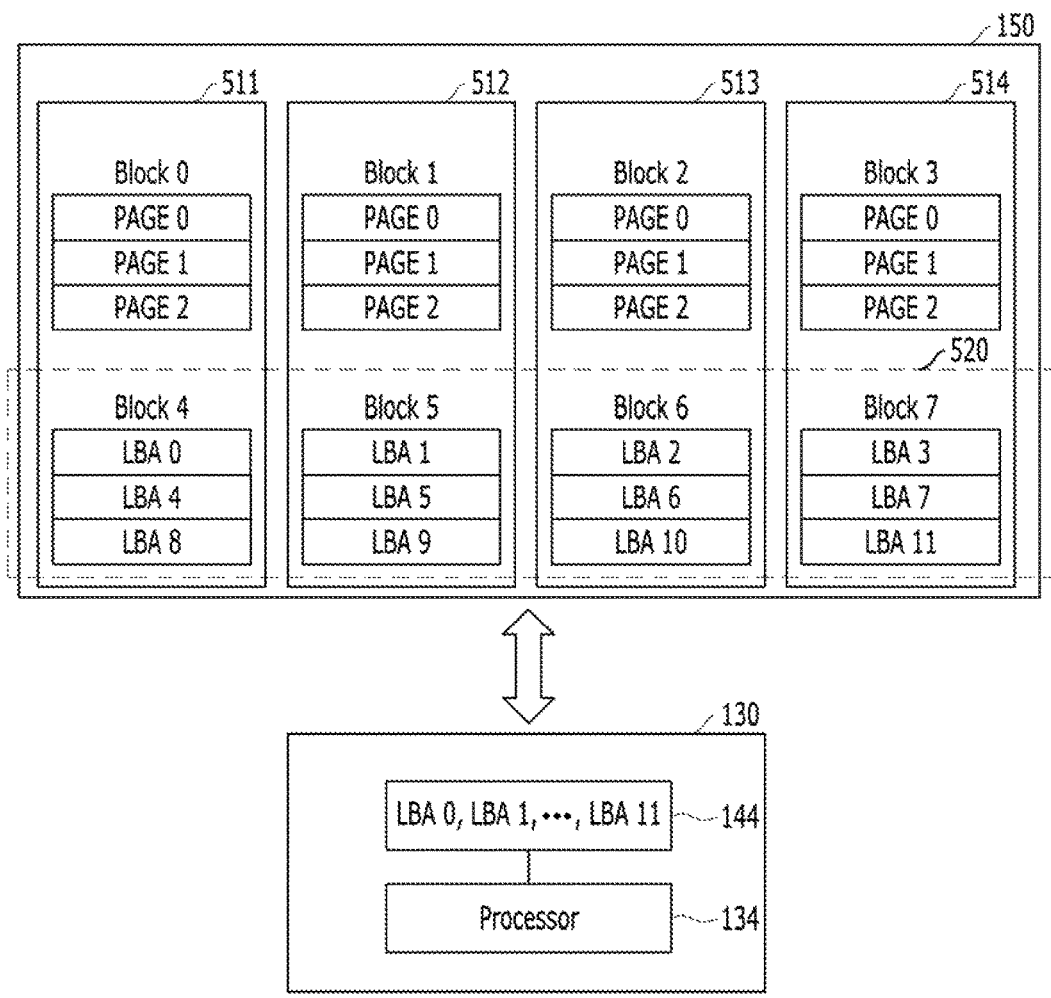
FIG. 8 illustrates a program operation to a super memory block in accordance with the embodiment of the present invention.

FIG. 8 illustrates a program operation to the super memory block 520 in the memory system 110 in accordance with the embodiment of the present invention.

Referring to FIG. 6, the processor unit 134 may decide whether or not a command that is received, for example, from a host 102 is a write command ("data command") in step S610. When the command is a write command (YES in the step S610), the processor unit 134 may go to step S620. When the command is not a write command (NO in the step S610), the processor unit 134 may go to step S660.

For example, referring to FIG. 7, since the data corresponding to the command are data LBA 17, LBA 57 and LBA 77 corresponding to logic block addresses 17, 57 and 77 (hereafter, data corresponding to logic block addresses is referred to as 'logic block data'), the processor unit 134 may decide the command as a write command and proceed to step S620.

Also, for example, referring to FIG. 8, since the data corresponding to the command are logic block data LBA 0 to LBA 11, the processor unit 134 may decide the command as a write command and proceed to step S620.

However, for example, when the command is a cache flush command the processor unit 134 may decide that the command is not a write command and proceed to step S660.

In step S620 it is decided whether or not the command is an FUA command. When the command is an FUA command (YES in the step S620), the processor unit 134 may proceed to step S630. When the command is not an FUA command (NO in the step S620), the processor unit 134 may proceed to step S640. In short, the processor unit 134 may decide in the step S620 whether the data corresponding to the command transferred from the host 102 is a data to be written in the memory device 150 instantly or not.

In step S630, the processor unit 134 may write the data corresponding to the command in the first memory blocks BLK 0 to BLK 3 of the memory device 150.

Referring to FIG. 7, the processor unit 134 may write logic block data LBA 17, LBA 57 and LBA 77 corresponding to the command, which are stored in the memory unit 144, in the first memory block BLK 0.

In step S640, it is decided whether or not the data corresponding to the command is a sequential data. When the data corresponding to the command is a sequential data (YES in the step S640), the processor unit 134 may proceed to step 650. When the data corresponding to the command is not a sequential data (NO in the step S640), the processor unit 134 may proceed to step 630.

Referring to FIG. 8 since the logic block data LBA 0 to LBA 11 corresponding to the command, which are stored in the memory unit 144, are sequential data, the processor unit 134 may proceed to step S650. However, as shown in FIG. 7, since the logic block data LBA 17, LBA 57 and LBA 77 corresponding to the command, which are stored in the memory unit 144, are random data, the processor unit 134 may proceed to step S630 and the logic block data LBA 17, LBA 57 and LBA 77 may be written in the first memory block BLK 0.

In step S650, the processor unit 134 may write the data corresponding to the command in the super memory block 520 of the memory device 150.

As illustrated in FIG. 8, the processor unit 134 may write in the super memory block BLK 4 to BLK 7 the logic block data LBA 0 to LBA 11 corresponding to the command, which are stored in the memory unit 144.

In step S660, it is decided whether the command is a cache flush command or not. When the command is a cache flush command (YES in the step S660), the processor unit 134 may proceed to the step S650. Otherwise, when the command is not a cache flush command (NO in the step S660), the processor unit 134 may proceed to step S670.

In step S670, the processor unit 134 may issue the command to the memory device 150. In other words, since it is decided in the step S670 that the command is neither write command nor cache flush command, the processor unit 134 may issue the command provided from the host 102 to the memory device 150 in order to control the memory device 150 to perform an operation in response to the issued command.

Since the memory system 110 in accordance with the embodiment of the present invention selects memory blocks between the first memory blocks BLK 0 to BLK 3 and the super memory block 520 based on the predetermined condition and writes data in the selected memory cells, the efficiency of the memory device 150 may be increased. In short, the size of the dummy data stored in the memory device 150 may be decreased.

Also, as the memory system 110 in accordance with the embodiment of the present invention stores sequential data in the super memory block 520, the read operation performance of the memory device 150 may be improved.

FIGS. 9 to 17 are schematic diagrams illustrating application examples of the data processing system 100.

Figure 9:
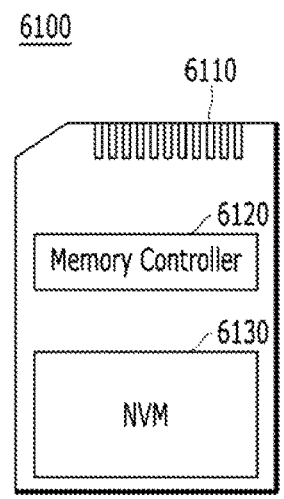
FIGS. 9 to 17 are diagrams illustrating application examples of the data processing system of FIG. 1 in accordance with various embodiments of the present invention.

FIG. 9 is a diagram schematically illustrating another example of the data processing system including the memory system in accordance with the present embodiment. FIG. 9 schematically illustrates a memory card system to which the memory system in accordance with the present embodiment is applied.

Referring to FIG. 9, the memory card system 6100 may include memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 5, and the memory device 6130 may correspond to the memory device 150 of the memory system 110 described with reference to FIGS. 1 and 5.

Thus, the memory controller 6120 may include a RAM, a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM) a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD microSD and SDHC) and a universal flash storage (UFS).

Figure 10:
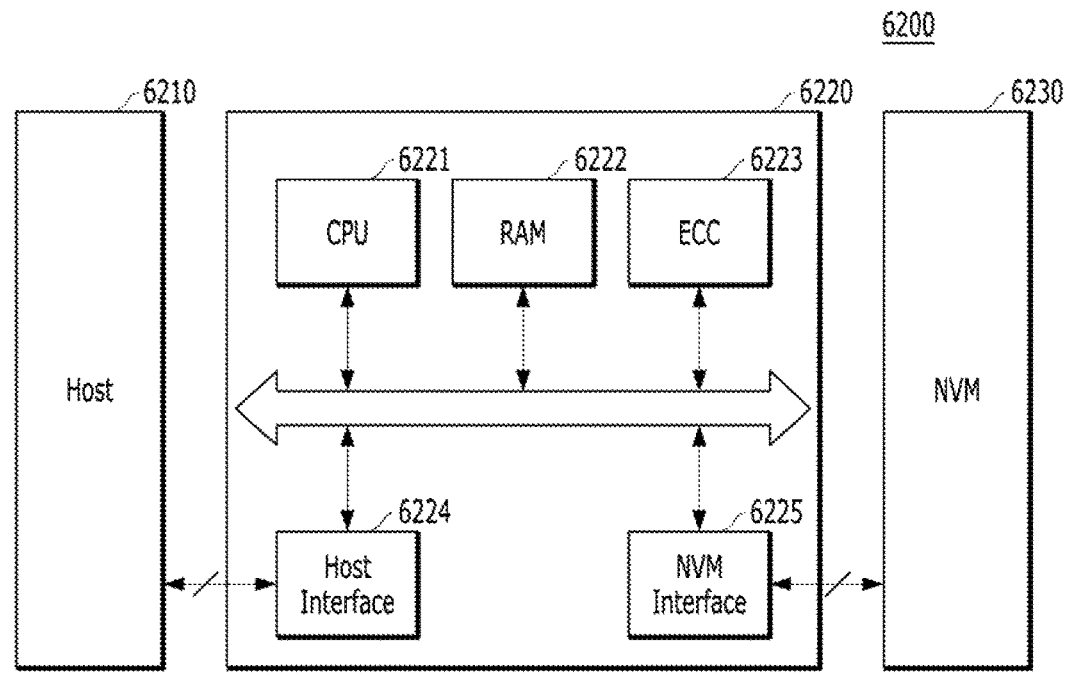

FIG. 10 is a diagram schematically illustrating another example of the data processing system including the memory system in accordance with the present embodiment.

Referring to FIG. 10, the data processing system 6200 may include a memory device 6230 having one or more nonvolatile memories and a memory controller 6220 for controlling the memory device 6230. The data processing system 6200 illustrated in FIG. 10 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an. ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 11:
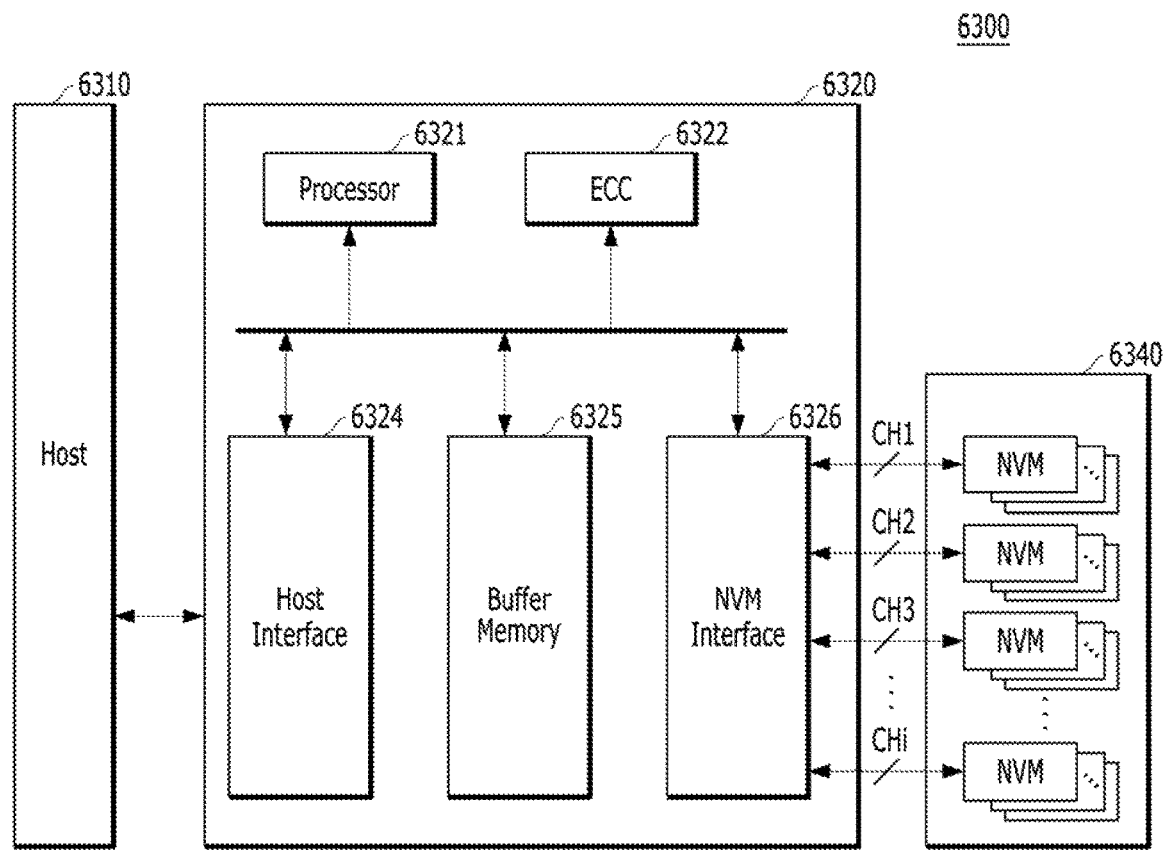

FIG. 11 is a block diagram schematically illustrating the data processing system including the memory system in accordance with the present embodiment. FIG. 11 schematically illustrates an SSD to which the memory system in accordance with the present embodiment is applied.

Referring to FIG. 11, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIGS. 1 and 5.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 11 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 12:
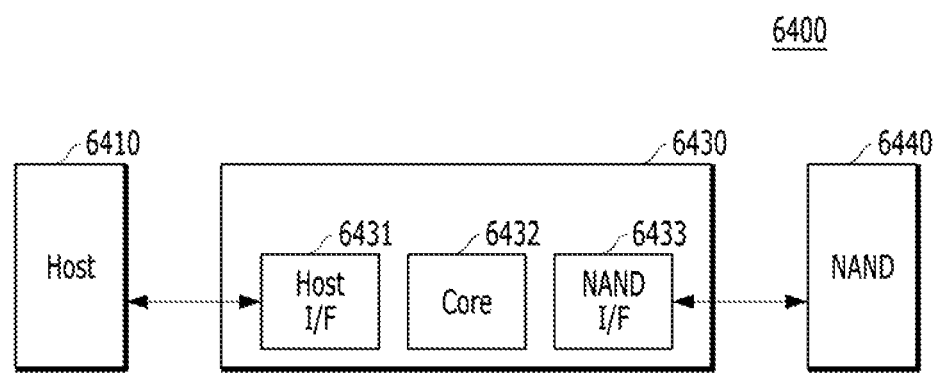

FIG. 12 is a diagram schematically illustrating another example of the data processing system including the memory system in accordance with the present embodiment. FIG. 12 schematically illustrates an embedded Multi-Media Card (eMMC) to which the memory system in accordance with the present embodiment is applied.

Referring to FIG. 12, the eMMC 6400 may include a controller 6430 and a memory device 6440 embodied by one or more NAND flash memories. The controller 6430 may correspond to the controller 130 in the memory system 110 of FIGS. 1 to 8, and the memory device 6440 may correspond to the memory device 150 in the memory system 110 of FIGS. 1 and 8.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 13 to 16 are diagrams schematically illustrating the data processing system including the memory system in accordance with the present embodiment, FIGS. 13 to 16 schematically illustrate UFS (Universal Flash Storage) systems to which the memory system in accordance with the present embodiment is applied.

Referring to FIGS. 13 to 16, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wire ess electronic devices or particularly mobile electronic devices through UFS protocols, and the UFS devices 6520, 6620, 6720 and 6820 and the UFS cards 6530, 6630, 6730 and 6830 may be embodied by the memory system 110 of FIGS. 1 to 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 10 to 12, and the UFS cards 6530, 6630, 6730 and 6830 may be embodied in the form of the memory card system 6100 described with reference to FIG. 9.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI Unified Protocol (UniPro) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 13:
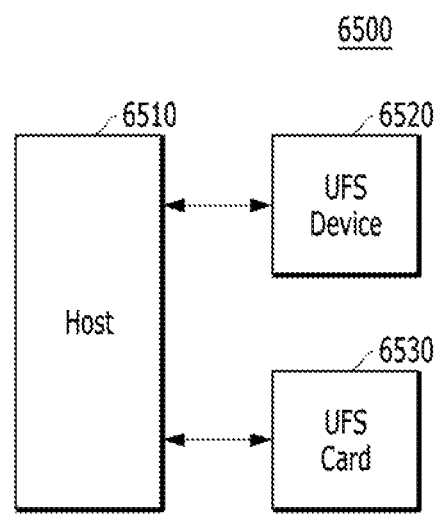

In the UFS system 6500 illustrated in FIG. 13, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro, At this time, the UPS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410 and a plurality of UFS cards may be connected in parallel or in the form of a star to the UFS device 6520 or connected in series or in the form of a chain to the UFS device 6520

Figure 14:
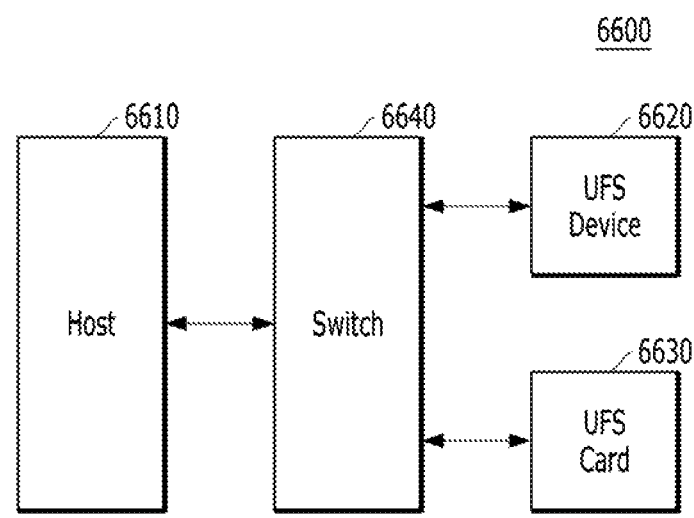

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 15:
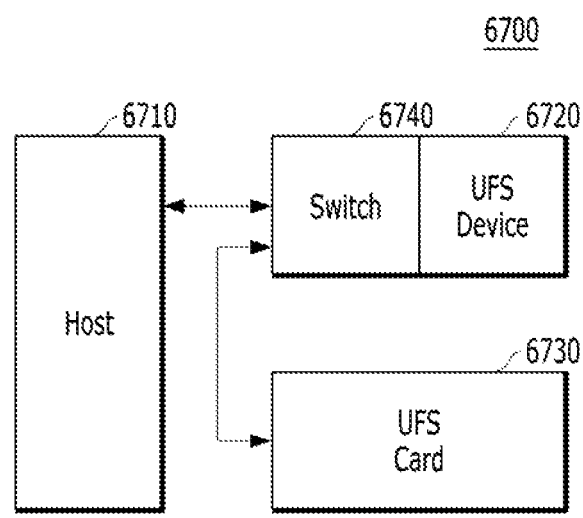

In the UFS system 6700 illustrated in FIG. 15, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
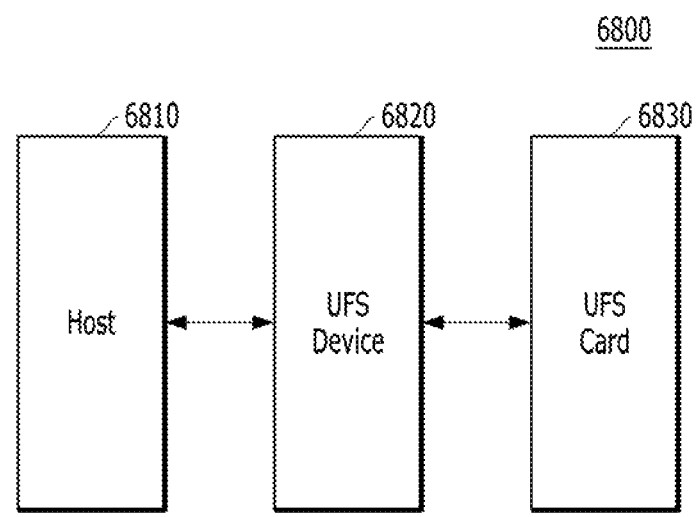

In the UFS system 6800 illustrated in FIG. 16, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 17:
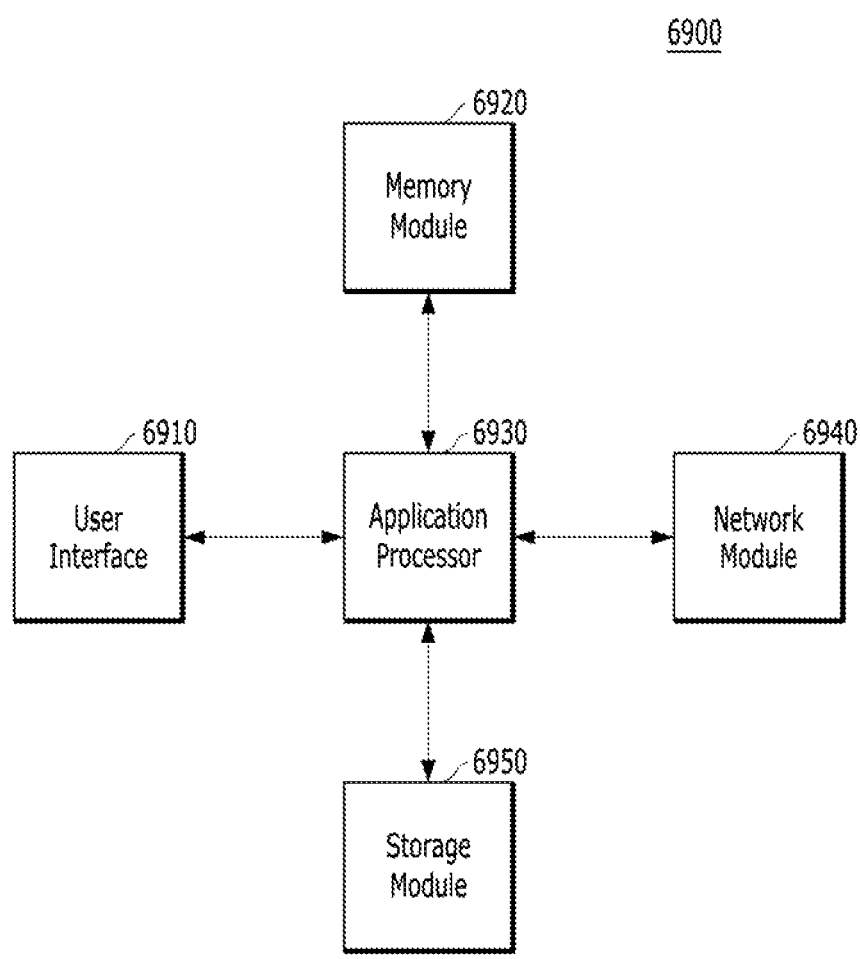

FIG. 17 is a diagram schematically illustrating another example of the data processing system including the memory system in accordance with an embodiment. FIG. 17 is a diagram schematically illustrating a user system to which the memory system in accordance with the present embodiment is applied.

Referring to FIG. 17, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on Package on Package (POP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000 time division multiple access (TDMA), long term evolution (LTE) worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data provided from the application processor 6930, and then, may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 to 8. Furthermore, the storage module 6950 may be embodied as an SSD, eMMC and UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen a touch pad, a touch ball a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 to 8 is applied to a mobile electronic device of the user system 6900, the application processor 6930 may control the overall operations of the mobile electronic device and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to the embodiments of the present invention, the memory system and the operating method of the memory system are capable of processing data rapidly and stably by using a memory device while minimizing the complexity and performance deterioration of the memory system and maximizing the efficiency of using the memory device.

While the present invention has been described with respect to specific embodiments, it will be apparent to those skilled in the art that various changes and modifications may be made without departing from the spirit and scope of the invention as defined in the following claims.

What is claimed is:

1. A memory system comprising:
   a memory device including a first memory block group and a second memory block group, where each of the first and second memory block groups includes memory blocks from each of a plurality of memory dies; and
   a controller suitable for performing a first program operation of programming data having units of a page into a single memory block among memory blocks included in the first memory block group in a one-shot program operation, performing a second program operation of programming data having units of super-blocks into memory blocks included in the second memory block group in an interleaving manner, and selectively performing the first and second memory program operations according to a type of a command and a type of the data,
   wherein the controller performs the first program operation when the type of the command is a Force Unit Access (FUA) command and the type of data is a random data, and
   wherein the controller performs the second program operation when the type of the command is a cache flush command and the type of the data is a sequential data.

2. The memory system of claim 1, wherein when a size of data, stored in a write buffer at the moment that the cache flush command is issued, is less than the units of the super-blocks, the controller performs the second program operation by adding dummy data to all of the data stored in the write buffer.

3. The memory system of claim 1, wherein when a size of data corresponding to the FUA command is less than the units of the page, the controller instantly performs the first program operation in response to the FUA command by adding dummy data to the data corresponding to the FUA command.

4. The memory system of claim 1, wherein when a size of the random data is less than the units of the page, the controller performs the first program operation by adding dummy data to the random data.

5. The memory system of claim 1, wherein when a size of the sequential data is less than the units of the super-blocks, the controller waits until a size of data stored in a write buffer reaches the units of the super-blocks and then performs the second program operation.

6. An operating method of a memory system, the operating method comprising:
- performing a first program operation of programming data having units of a page into a single memory block among memory blocks included in a first memory block group in a one-shot program operation, where the first memory block group includes memory blocks from each of a plurality of memory dies;
- performing a second program operation of programming data having units of super-blocks into memory blocks included in a second memory block group in an interleaving manner, where the second memory block group includes memory blocks from each of the memory dies; and
- selectively performing the first and second program operations according to a type of a command and a type of the data,
- wherein the first program operation is performed when the type of the command is a Force Unit Access (FUA) command and the type of data is a random data, and
- wherein the second program operation is performed when the type of command is a cache flush command and the type of the data is sequential data.

7. The method of claim 6, wherein when a size of data stored in a write buffer at the moment that the cache flush command is issued is less than the units of the super-blocks, the second program operation is performed by adding dummy data to all of the data stored in the write buffer.

8. The method of claim 6, wherein when a size of data corresponding to the FUA command is less than the units of the page, the first program operation is instantly performed in response to the FUA command by adding dummy data to the data corresponding to the FUA command.

9. The method of claim 6, wherein when a size of the random data is less than the units of the page, the first program operation is performed by adding dummy data to the random data.

10. The method of claim 6, wherein when a size of the sequential data is less than the units of the super-blocks, the second program operation is performed after a size of data stored in a write buffer reaches the units of the super-blocks.

* * * * *